United States Patent
Wang et al.

(10) Patent No.: US 7,359,577 B2
(45) Date of Patent: Apr. 15, 2008

(54) DIFFERENTIAL METHOD FOR LAYER-TO-LAYER REGISTRATION

(76) Inventors: Yan Wang, 3505 Hillrose Dr., Richardson, TX (US) 75082; Youling Lin, 3505 Hillrose Dr., Richardson, TX (US) 75082

( * ) Notice: Subject to any disclaimer, the term of this patent is extended or adjusted under 35 U.S.C. 154(b) by 681 days.

(21) Appl. No.: 10/889,038

(22) Filed: Jul. 13, 2004

(65) Prior Publication Data

US 2006/0011823 A1 Jan. 19, 2006

(51) Int. Cl.
*G06K 9/32* (2006.01)
(52) U.S. Cl. ............ 382/294; 382/141; 382/145; 382/151; 348/87; 348/95
(58) Field of Classification Search ............ 382/141, 382/144, 145, 147, 151, 152, 294; 348/86, 348/87, 94
See application file for complete search history.

(56) References Cited

U.S. PATENT DOCUMENTS

| | | | |
|---|---|---|---|
| 4,233,625 A | 11/1980 | Altman | |
| 4,353,087 A | 10/1982 | Berry et al. | |
| 4,550,374 A | 10/1985 | Meshman et al. | |
| 4,641,257 A | 2/1987 | Ayata | |
| 4,791,586 A | 12/1988 | Maida et al. | |
| 4,794,648 A | 12/1988 | Ayata et al. | |
| 5,109,430 A | 4/1992 | Nishihara et al. | |
| 5,170,058 A * | 12/1992 | Berasi et al. | 250/548 |
| 5,442,616 A * | 8/1995 | Ogata et al. | 369/44.23 |
| 5,559,601 A * | 9/1996 | Gallatin et al. | 356/490 |
| 5,643,699 A * | 7/1997 | Waldner | 430/22 |
| 5,696,835 A | 12/1997 | Hennessey et al. | |
| 6,268,920 B1 * | 7/2001 | Ohlig | 356/401 |
| 6,447,964 B2 * | 9/2002 | Okino et al. | 430/30 |
| 6,462,818 B1 * | 10/2002 | Bareket | 356/401 |
| 6,509,750 B1 * | 1/2003 | Talbot et al. | 324/750 |
| 6,838,667 B2 * | 1/2005 | Tsuneta et al. | 250/306 |
| 6,899,982 B2 * | 5/2005 | McArthur et al. | 430/22 |

OTHER PUBLICATIONS

Hahn, Kwang-Soo, "Investigation of a Fuzzy Grammer for Automated Visual Inspection", Texas Tech Univ., Lubbock, TX, US, Aug. 1989, Dissertation in Interdisciplary Engineering.

Lin, Youling, "Techniques for Syntactic Analysis of Images with Application for Automatic Visual Inspection", Texas Tech Univ., Lubbock, TX, US, 1990, Dissertation in Bus. Admin.

* cited by examiner

*Primary Examiner*—Yosef Kassa

(57) ABSTRACT

A system for precisely measuring layer-to-layer mis-registration is provided. The system includes a new type of mark and a comparison system, which compare the right and left signals from the mark to eliminate non-alignment noise, to enlarge the alignment information hundreds times then the actual shiftiness between two layers and to measure the mis-registration.

6 Claims, 3 Drawing Sheets

DIFFERENTIAL METHOD FOR LAYER-TO-LAYER REGISTRATION

FIELD OF THE INVENTION

The invention related to the precisely alignment between layers. The application which exist in semiconductor wafer manufacturing layer to layer alignment, or any other place need precise alignment.

BACKGROUND

When need precisely to align one object to another object, usual way is to put align mark to each object, then to measure the shift between these two marks to decide the shiftiness of the two object, then to align them. Unfortunately, when the precision requirement reaches nm level, it could not be accurately measured optically because optical wavelets limitation. It can use light diffraction such as applying grating structure, but because the line thickness also affect the light diffraction, to use grating diffracting to measure layer to layer shiftiness still has problems.

SUMMARY OF THE INVENTION

The invention is to use different pitch grating for two layers. By compare left and right reflected/diffracted or any combined light signal, to decide the mis-aligned information. By this method, all unrelated things such as grating thickness or line width signals will be canceled each other, and only the shiftiness signal will be enlarged dozens or hundreds times, even the stiffness is sub-nm, the final signal from this invention will be hundred nm large, and can be actually measured optically.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF PREFERED EMBODIMENTS

Figure 1:
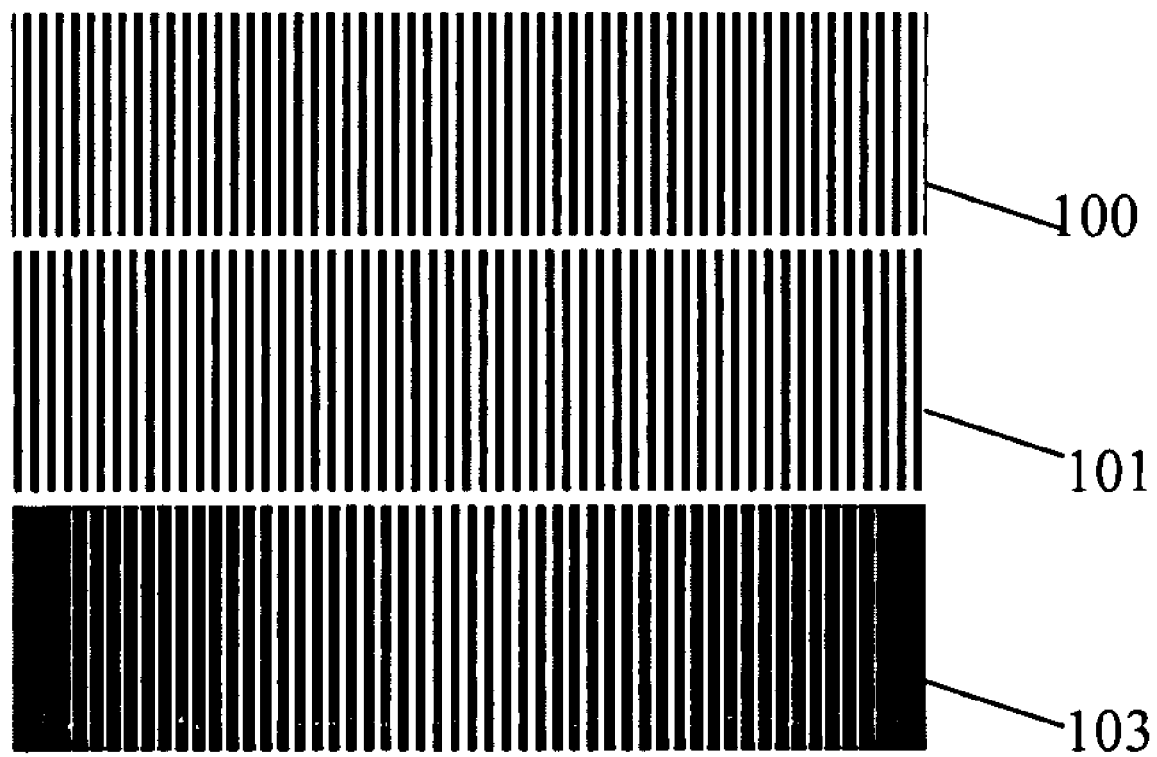
FIG. 1 exemplifies, in accordance with principles of the present invention, a grating 100 having a pitch of n, a grating 101 having a pitch of n+1, and a grating 103 in which the grating 100 overlaps the grating 101.

Referring now to the drawing, and in particular to FIG. 1, grating 100 has a pitch n, for example, 50 um, grating 101 has a pitch n+1, in this example is 51 um. 102 are overlapped grating.

Figure 2:
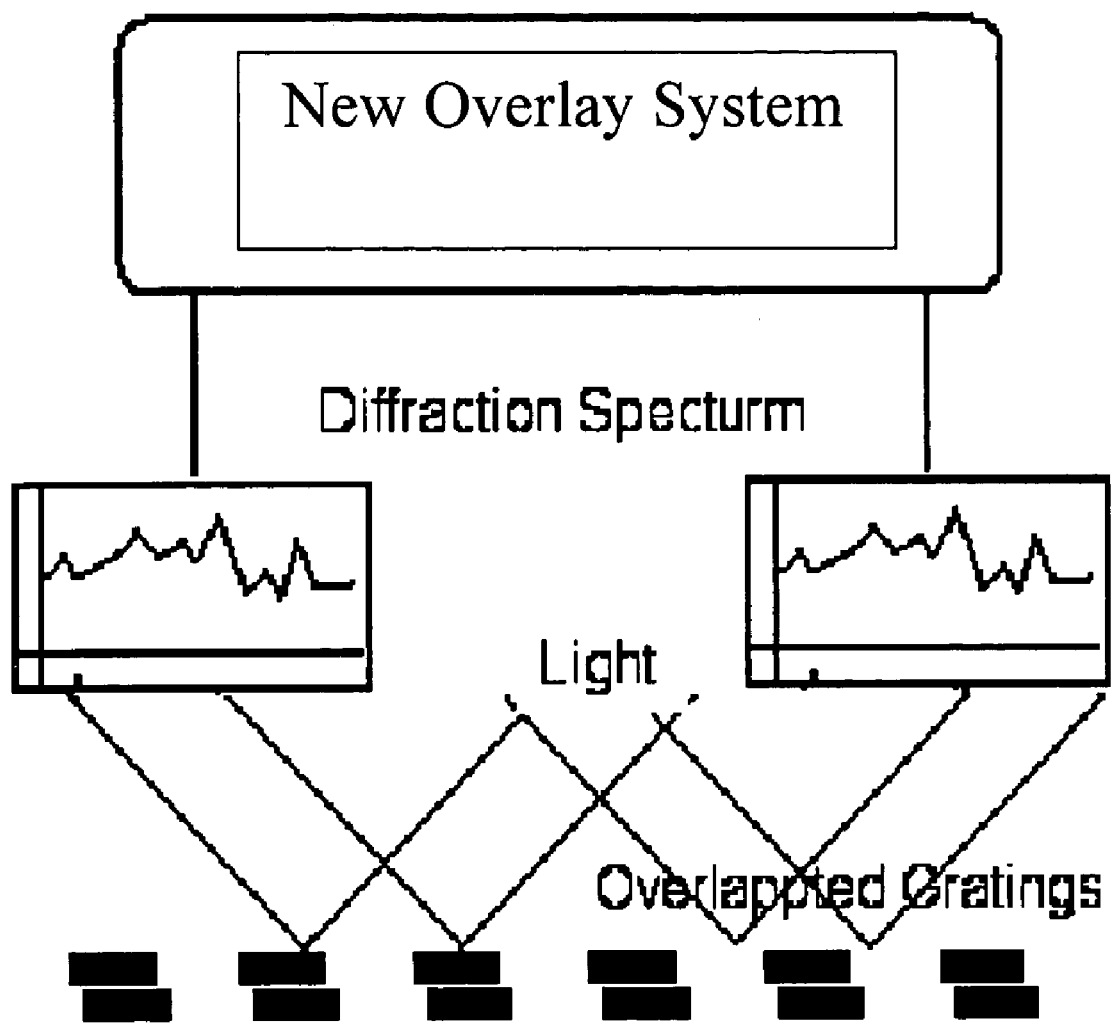
FIG. 2 exemplifies a system that, in accordance with principles of the present invention, catches the reflecting, diffracting, and/or interference light from overlapped gratings, and compares the left and right deference.

Referring now to FIG. 2, a system catch the reflecting/diffracting/interference light from the overlapped gratings, to compare left and right deference.

Let $d_1$ be line pitch of previous layer mark, $d_2$ be line pitch of current layer mark, c is a constant, $\Delta s$ be actual shift between layers, the overlapped grating image intensity meets the following equation $$\frac{x_p}{d_1}(d_2 - d_1) - \Delta s = \frac{x_0}{d_1}(d_2 - d_1)$$

The FIG. 2 system 103 will see the shift $\Delta x = x_p - x_0$:

$$\Delta x = x_p - x_0 = \left(\frac{d_1}{d_2 - d_1}\right)\Delta s$$

Figure 3:
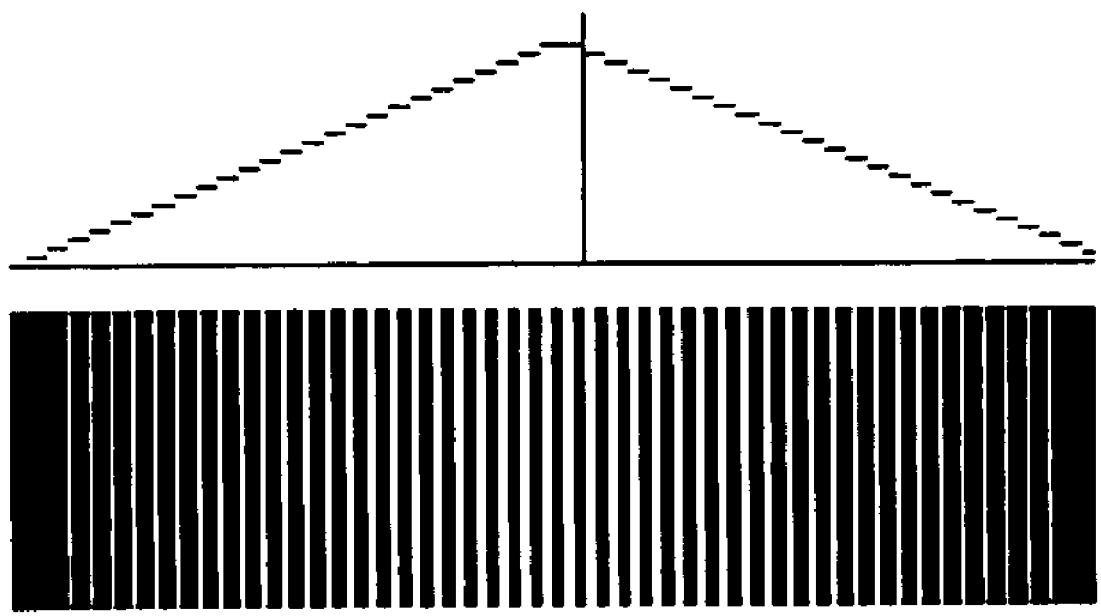
FIG. 3 exemplifies an overlapped grating having about 500 nm shiftiness observation, while the actual shiftiness between two gratings is only about 10 nm.

This means that the overlaid image distribution shift $\Delta x$ (compare left and right) is $d_1/(d_2-d_1)$ times large then actual lay shift $\Delta s$. Use $d_1=0.5$ um, $d_2=0.51$ um value here, the enlargement here is 50 times, as shown in FIG. 3. The picture shows a 10 nm shift between two layers, the microscopy observed 500 nm shiftiness, which is very easy to measure.

The invention claimed is:

1. A method for aligning two selected layers of two or more layers of a semiconductor wafer, a first layer of said two selected layers defining a first mark of at least one mark of said first layer, said first mark having a pitch grating $d_1$, a second layer of said two selected layers defining a second mark of at least one mark of said second layer, said second mark having a pitch grating $d_2$, said first mark and said second mark overlapping each other, the method comprising steps of:

directing light from at least one light source to at least one first portion and at least one second portion of each of said first and second marks;

receiving at least one first signal from said light directed at said at least one first portion of each of said first and second marks;

receiving at least one second signal from said light directed at said at least one second portion of said first and second marks;

comparing said at least one first signal and said at least one second signal to determine an overlaid image distribution shift $\Delta x$;

determining an actual lay shift $\Delta s = \Delta x(d_2-d_1)/d_1$; and adjusting said two selected layers of said semiconductor wafer by said $\Delta s$ relative to each other to thereby align said two selected layers of said semiconductor wafer with each other.

2. The method of claim 1, wherein the step of comparing further comprises comparing said at least one first signal and said at least one second signal to determine by means of optical measurements an overlaid image distribution shift $\Delta x$.

3. The method of claim 1:

wherein said light directed at said at least one first portion of said first and second marks is at least one of reflected and diffracted from said at least one first portion of said first and second marks;

wherein the step of receiving said at least one first signal further comprises receiving said at least one first signal from said light directed at, and at least one of reflected and diffracted from, said at least one first portion of said first and second marks;

wherein said light directed at said at least one second portion of said first and second marks is at least one of reflected and diffracted from said at least one second portion of said first and second marks; and wherein the step of receiving said at least one second signal further comprises receiving said at least one second signal from said light directed at, and at least one of reflected and diffracted from, said at least one second portion of said first and second marks.

4. An apparatus for aligning two selected layers of two or more layers of a semiconductor wafer, a first layer of said two selected layers defining a first mark of at least one mark of said first layer, said first mark having a pitch grating $d_1$, a second layer of said two selected layers defining a second mark of at least one mark of said second layer, said second mark having a pitch grating $d_2$, said first mark and said second mark overlapping each other, the method comprising steps of:
- at least one light source configured for directing light to at least one first portion and at least one second portion of each of said first and second marks;
- at least one first receiver configured and positioned relative to said at least one light source and said semiconductor wafer for receiving at least one first signal from said light directed at said at least one first portion of each of said first and second marks;
- at least one second receiver configured and positioned relative to said at least one light source and said semiconductor wafer for receiving at least one second signal from said light directed at said at least one second portion of said first and second marks;
- a comparator coupled to said at least one first receiver and said at least one second receiver for receiving and comparing said at least one first signal and said at least one second signal to determine an overlaid image distribution shift $\Delta x$
- a determiner coupled to said comparator for determining an actual lay shift $\Delta s = \Delta x(d_2-d_1)/d_1$; and
- an adjuster coupled to said determiner for receiving said $\Delta s$ and for adjusting said two selected layers of said semiconductor wafer by said $\Delta s$ relative to each other to thereby align said two selected layers of said semiconductor wafer with each other.

5. The apparatus of claim 4, wherein said comparator is further configured for receiving and comparing said at least one first signal and said at least one second signal to determine by means of optical measurements an overlaid image distribution shift $\Delta x$.

6. The apparatus of claim 4:
- wherein said light directed at said at least one first portion of said first and second marks is at least one of reflected and diffracted from said at least one first portion of said first and second marks;
- wherein said at least one first receiver is further configured for receiving said at least one first signal from said light directed at, and at least one of reflected and diffracted from, said at least one first portion of said first and second marks;
- wherein said light directed at said at least one second portion of said first and second marks is at least one of reflected and diffracted from said at least one second portion of said first and second marks; and
- wherein said at least one second receiver is further configured for receiving said at least one second signal from said light directed at, and at least one of reflected and diffracted from, said at least one second portion of said first and second marks.

* * * * *